(12) United States Patent
Wong et al.

(10) Patent No.: US 7,176,113 B1
(45) Date of Patent: Feb. 13, 2007

(54) LDC IMPLANT FOR MIRRORBIT TO IMPROVE VT ROLL-OFF AND FORM SHARPER JUNCTION

(75) Inventors: Nga-Ching Alan Wong, San Jose, CA (US); Weidong Qian, Sunnyvale, CA (US); Sameer Haddad, San Jose, CA (US); Mark Randolph, San Jose, CA (US); Mark Ramsbey, Sunnyvale, CA (US); Tazrien Kamal, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 220 days.

(21) Appl. No.: 10/862,636

(22) Filed: Jun. 7, 2004

(51) Int. Cl.
*H01L 21/425* (2006.01)
(52) U.S. Cl. ................. 438/526; 257/E21.135
(58) Field of Classification Search ................ 438/510, 438/514, 526, 527
See application file for complete search history.

(56) References Cited

U.S. PATENT DOCUMENTS

| | | | |
|---|---|---|---|
| 6,215,148 B1 | 4/2001 | Eitan | |
| 6,383,952 B1 | 5/2002 | Subramanian et al. | |
| 6,410,388 B1 | 6/2002 | Kluth et al. | |
| 6,436,768 B1 | 8/2002 | Yang et al. | |
| 6,440,797 B1 | 8/2002 | Wu et al. | |
| 6,465,303 B1 | 10/2002 | Ramsbey et al. | |
| 6,477,084 B1 | 11/2002 | Eitan | |
| 6,479,348 B1 | 11/2002 | Kamal et al. | |
| 6,492,670 B1 | 12/2002 | Yu | |
| 6,524,913 B1 | 2/2003 | Lin et al. | |
| 6,566,194 B1 | 5/2003 | Ramsbey et al. | |
| 6,573,140 B1 | 6/2003 | Ogura et al. | |
| 6,590,811 B1 | 7/2003 | Hamilton et al. | |
| 6,617,215 B1 | 9/2003 | Halliyal et al. | |
| 6,620,717 B1 | 9/2003 | Kamal et al. | |
| 6,630,384 B1 | 10/2003 | Sun et al. | |
| 6,653,190 B1 | 11/2003 | Yang et al. | |

OTHER PUBLICATIONS

Solid State Technology's WaferNEWS, The Semiconductor Equipment and Materials Weekly Briefing, Mar. 17, 2003, v10n11, 11 pgs.

*Primary Examiner*—Scott B. Geyer
(74) *Attorney, Agent, or Firm*—Eschweiler & Associates, LLC

(57) ABSTRACT

The present invention pertains to implementing a lightly doped channel (LDC) implant in fashioning a memory device to improve Vt roll-off, among other things. The lightly doped channel helps to preserve channel integrity such that a threshold voltage (Vt) can be maintained at a relatively stable level and thereby mitigate Vt roll-off. The LDC also facilitates a reduction in buried bitline width and thus allows the bitlines to be brought closer together. As a result more devices can be formed or "packed" within the same or a smaller area.

25 Claims, 12 Drawing Sheets

LDC IMPLANT FOR MIRRORBIT TO IMPROVE VT ROLL-OFF AND FORM SHARPER JUNCTION

RELATED APPLICATIONS

This application is related to U.S. patent application Ser. No. 10/755,430, filed on Jan. 12, 2004, entitled "NARROW BITLINE USING SAFIER FOR MIRROR BIT", U.S. patent application Ser. No. 10/729,732, filed on Dec. 5, 2003, entitled "HARD MASK SPACER FOR SUBLITHOGRAPHIC BITLINE" and U.S. patent application Ser. No. 10/755,740, filed on Jan. 12, 2004, entitled POCKET IMPLANT FOR BIT DISTURB IMPROVEMENT AND CHARGING IMPROVEMENT OF SONOS MEMORY CELL."

FIELD OF INVENTION

The present invention relates generally to memory for computer systems and the like, and in particular to implementing a lightly doped channel (LDC) implant when fabricating a memory device so as to improve Vt roll-off, reduce bitline width and facilitate scaling and increased packing density.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc. Flash memory is generally constructed of many memory cells where single bits of data are stored in and read from respective memory cells.

Individual memory cells are generally organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The traditional memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined potential above the source. A resulting high electric field across the tunnel oxide leads to the Fowler-Nordheim tunneling phenomena. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage (Vt) and an unprogrammed threshold voltage. The resulting current is measured, by which a determination is made as to the data value stored in the cell.

A very modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto individual semiconductor wafers (or die).

One technique to pack more memory cells/transistors into a smaller area is to form their structures and component elements closer together. Forming bitlines closer together, for example, shortens the length of a channel defined therebetween and allows more devices to be formed in the same area. This can, however, cause certain phenomena to become more prevalent and have a substantial impact on device performance. For example, Vt roll-off may become more pronounced as respective channel lengths are decreased. In particular, a threshold voltage (Vt), or voltage at which a transistor or memory cell "turns on" or becomes active to store and/or erase a bit of data (e.g., a charge), may vary (e.g., become reduced) as the respective channel length is decreased (e.g., source and drain regions are brought closer together). Additionally, the severity of Vt roll-off may vary among different memory cells. In this manner, not all of a selected group of memory cells may be programmed/erased when the same or a similar voltage is applied to the cells. This could result in corrupt data and/or inaccurately stored or programmed data.

Similarly, other issues, such as leakage current and cross talk can also result from scaling. For example, isolating two bits or charges stored in a charge trapping layer becomes increasingly difficult as the channel length is decreased and the bits are brought closer together. In this manner, crosstalk can occur, the bits can contaminate one another and operations performed on one bit can affect the other bit (sometimes referred to complimentary bit disturb or CBD). Accordingly, it would be desirable to reduce feature sizes so as to increase packing density while mitigating the adverse affects that may result there-from, such as Vt roll-off and CBD.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to implementing a lightly doped channel (LDC) implant in fashioning a memory device to improve Vt roll-off, among other things. The lightly doped channel helps to preserve channel integrity such that a threshold voltage (Vt) can be maintained at a relatively stable level and thereby mitigate Vt roll-off. The LDC also facilitates a reduction in buried bitline width and thus allows the bitlines to be brought closer together. As a result more devices can be formed or "packed" within the same or a smaller area.

According to one or more aspects of the present invention, a method of forming at least a portion of a dual bit memory core array upon a semiconductor substrate is disclosed. The method includes forming a portion of a charge trapping dielectric layer over the substrate, and forming a hardmask over the portion of the charge trapping dielectric layer. The hardmask is then patterned to form hardmask features having respective first spacings there-between, the first spacings having respective first widths. A lightly doped channel (LDC) implant is then performed through the exposed portion of the charge trapping dielectric layer to establish LDC regions within the substrate. The LDC regions have respective LDC widths corresponding substantially to the first widths of the hardmask openings. A spacer material is then formed over the hardmask features and exposed areas of the portion of the charge trapping dielectric layer. The spacer material is patterned to form sidewall spacers adjacent to the hardmask features. Respective second spacings having respective second widths are thus defined between the sidewall spacers, where the second widths are less than the first widths. A bitline implant is then performed through the portion of the charge trapping dielectric layer to establish buried bitlines within the substrate having respective bitline widths corresponding substantially to the second widths. The patterned hardmask features and sidewall spacers are then removed, and the remainder of the charge trapping dielectric layer is formed over the portion of the charge trapping dielectric layer. A wordline material is then formed over the charge trapping dielectric layer. Finally, the wordline material is patterned to form wordlines that overlie the LDC regions and the buried bitlines.

In accordance with one or more other aspects of the present invention, a method of forming at least a portion of a dual bit memory core array upon a semiconductor substrate is disclosed. The method includes forming at least a portion of a charge trapping dielectric layer over the substrate, and forming a layer of sacrificial material over the portion of the charge trapping dielectric layer. A hardmask is then formed over the sacrificial layer and is patterned to form hardmask features having respective first spacings there-between, wherein the first spacings have respective first widths. A lightly doped channel (LDC) implant is then performed through the portion of the charge trapping dielectric layer to establish LDC regions within the substrate. The LDC regions have respective LDC widths corresponding substantially to the first widths. A spacer material is then formed over the hardmask features and exposed areas of the portion of the charge trapping dielectric layer. The spacer material is patterned to form sidewall spacers adjacent to the hardmask features. Respective second spacings having respective second widths are thus defined between the sidewall spacers, where the second widths are less than the first widths. A bitline implant is then performed through the portion of the charge trapping dielectric layer to establish buried bitlines within the substrate having respective bitline widths corresponding substantially to the second widths. The patterned hardmask features and sidewall spacers are then removed, as is the layer of sacrificial material. Finally, the remaining portion of the charge trapping dielectric layer is formed over the portion of the charge trapping dielectric layer.

According to one or more other aspects of the present invention, a dual bit memory device that is formed upon and out of a semiconductor substrate is disclosed. The memory device includes a charge trapping dielectric layer formed over the substrate, and a gate structure that is situated over a channel region that is established within the substrate between buried bitlines that serve as source and drain regions. Lightly doped channel regions are also included within the device. The lightly doped channel regions surround the buried bitlines and extend into the channel region.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
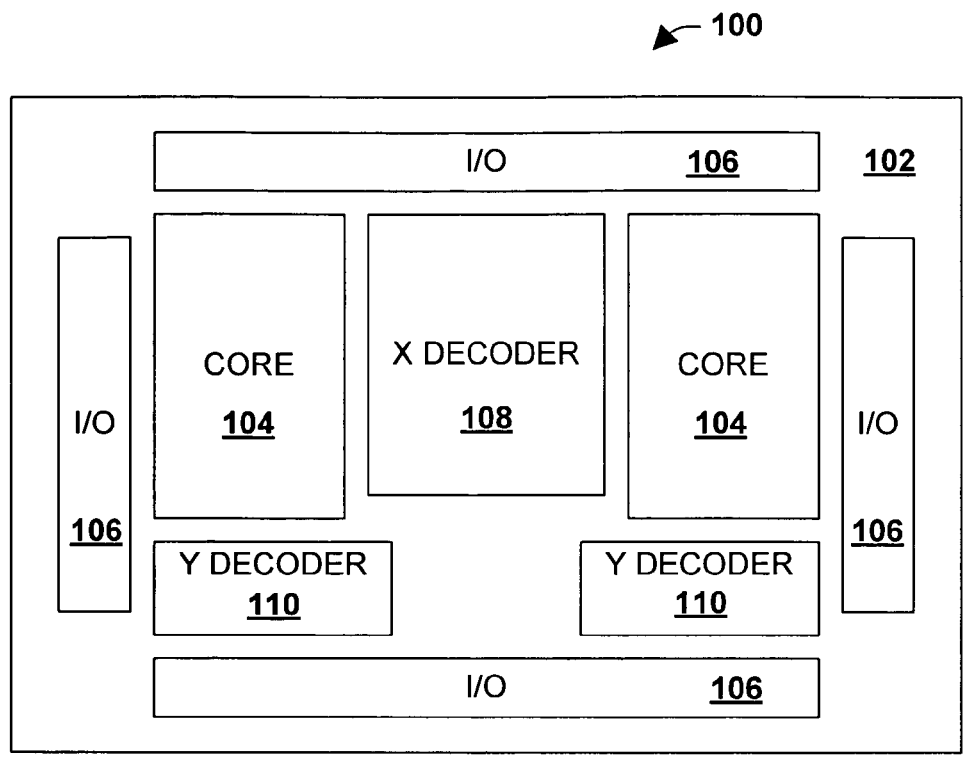
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to implementing a lightly doped channel (LDC) implant in fashioning a memory device to improve Vt roll-off, among other things. The lightly doped channel helps to preserve channel integrity such that a threshold voltage (Vt) can be maintained at a relatively stable level and thereby mitigate Vt roll-off. The LDC also facilitates a reduction in buried bitline width and thus allows the bitlines to be brought closer together. As a result more devices can be formed or "packed" within the same or a smaller area.

Referring initially to FIG. 1, a top view of an exemplary dual bit flash EEPROM 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
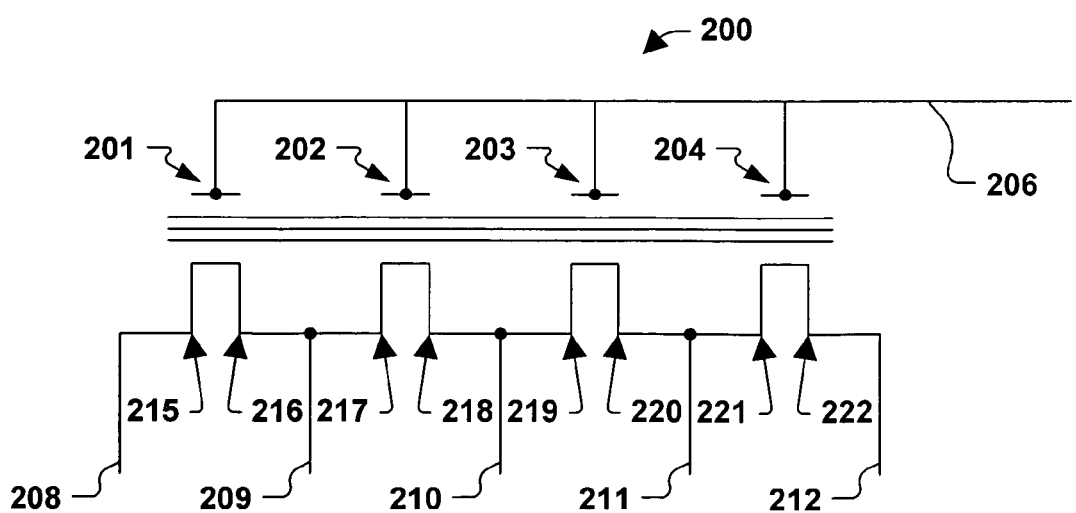
FIG. 2 is a schematic illustration of a portion of a memory core such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
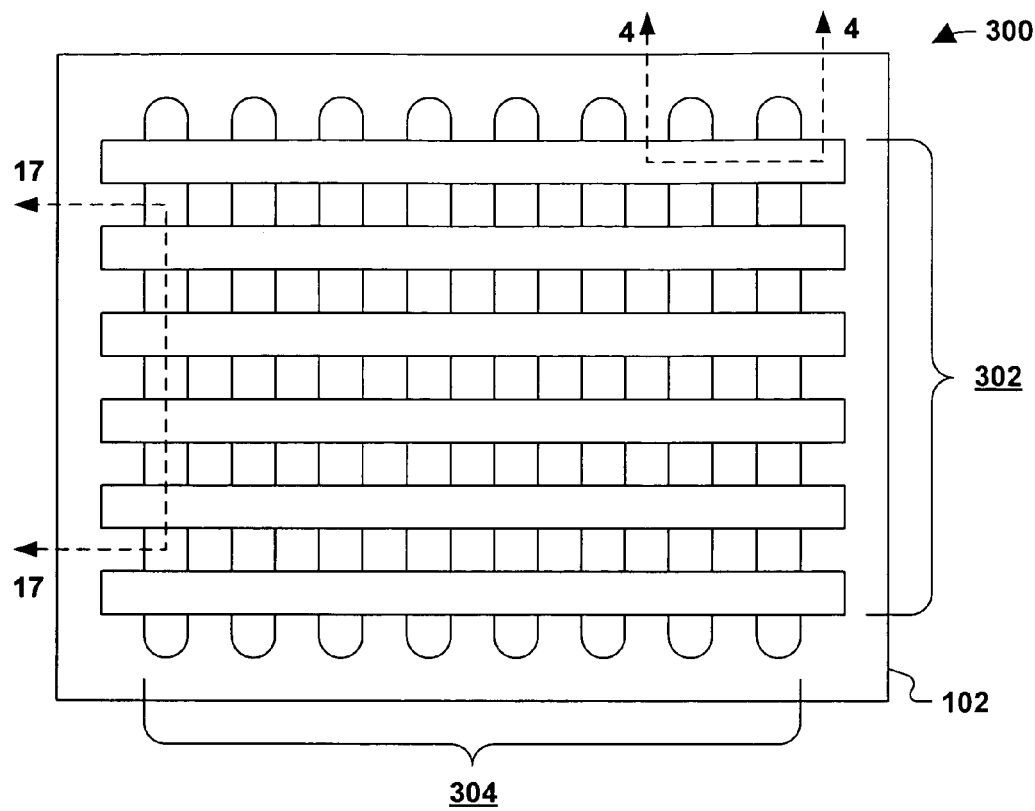
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
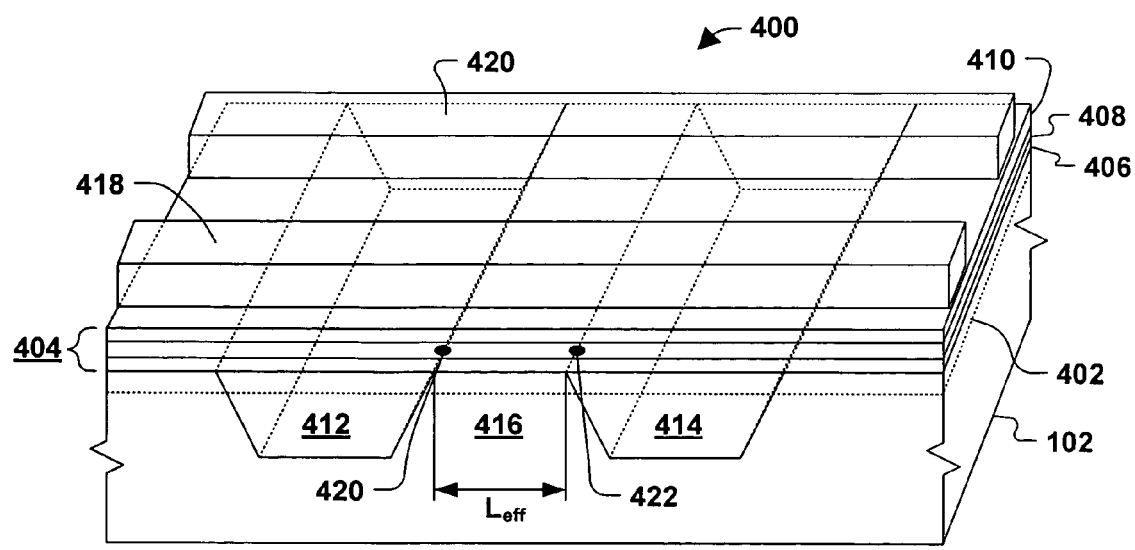
FIG. 4 is a cross-sectional isometric illustration of a portion of a dual bit flash memory, such as that taken along line 4—4 of FIG. 3.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another. Accordingly, the degree to which the memory can be scaled via channel length reduction in some cases is limited and a technique for reducing the size of the device without reducing the channel length (e.g., below some effective length $L_{eff}$) would be desirable.

Figure 5:
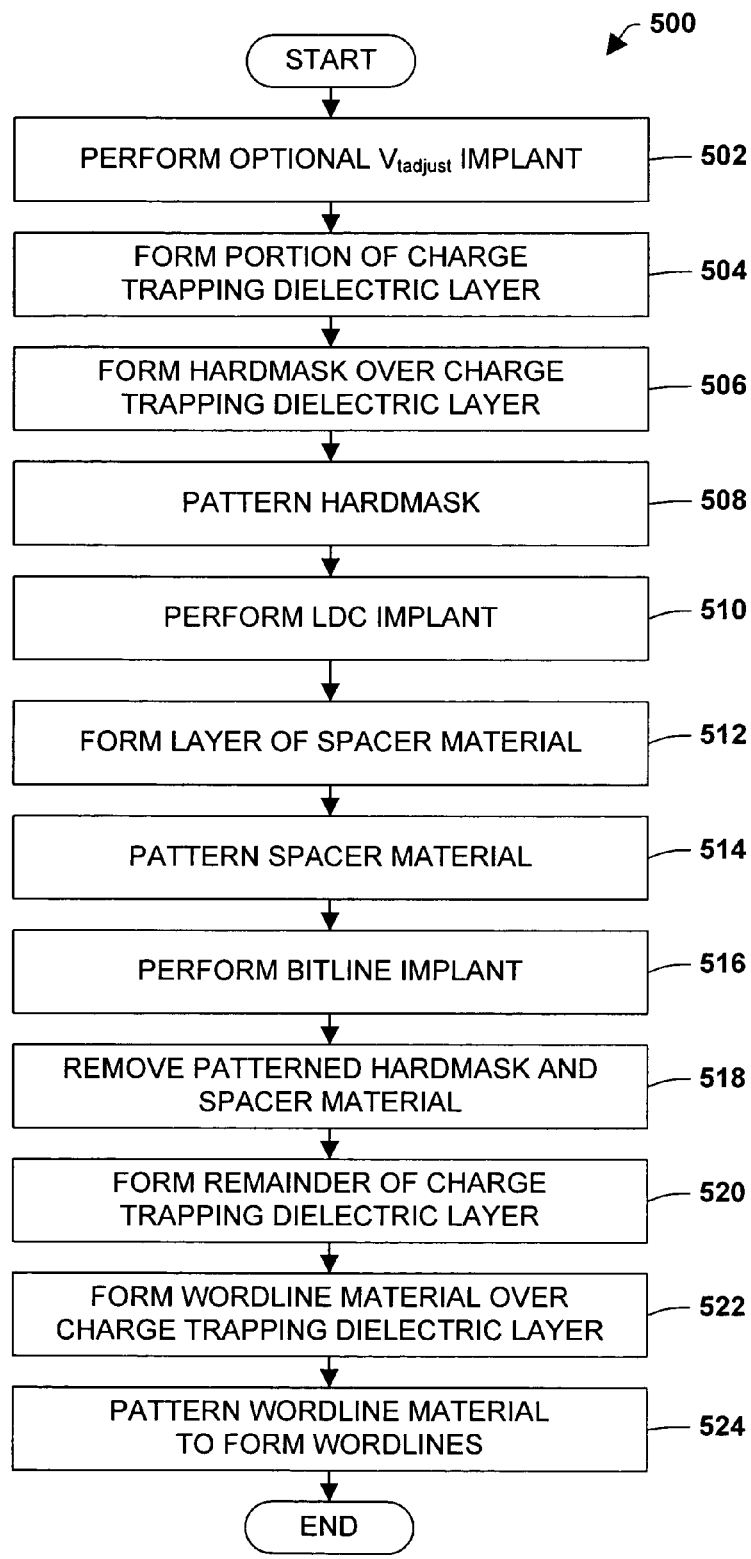
FIG. 5 is a flow diagram illustrating an example of a methodology for forming a memory device in accordance with one or more aspects of the present invention wherein a low density channel (LDC) implant is implemented to improve Vt roll-off and facilitate an increase in packing density.

Turning to FIG. 5, a methodology 500 is illustrated for forming a memory device according to one or more aspects of the present invention. In particular, the memory is formed with lightly doped channel (LDC) implants so as to mitigate threshold voltage (Vt) roll-off and facilitate scaling via bitline width reduction. The memory device so formed may, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 6–21, as well as to devices not shown or described herein.

The memory is formed upon a semiconductor substrate and at 502 an optional threshold adjustment implant $V_{tadjust}$ is performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory.

At 504 a portion of a charge trapping dielectric layer is formed over the semiconductor substrate. This portion of a charge trapping dielectric layer includes a first insulating layer and a charge trapping layer. The first insulating layer may be formed of an oxide dielectric such as silicon dioxide ($SiO_2$), for example, and the charge trapping layer may be formed of a nitride dielectric such as silicon nitride ($Si_xN_y$), for example. The first insulating layer can be formed to a thickness of about 70 Angstroms or less, for example, while the charge trapping layer can be formed to a thickness between about 60 to 80 Angstroms.

A layer of hardmask material is then formed over the charge trapping layer at 506. An optional antireflective coating (ARC) layer (e.g., of an organic material, such as silicon nitride or silicon oxynitride) can be formed over the hardmask, and a resist can be formed over the ARC layer to facilitate patterning the hardmask. The ARC layer in particular assists with mitigating reflection during exposure and thereby improves the fidelity of pattern transfer. The hardmask can, for example, be formed from nitride and/or poly-based material(s) that are applied to a thickness of between about 500 to 1200 Angstroms, for example.

The hardmask is then patterned at 508 (e.g., after both the resist and optional ARC layers have been patterned, exposed, etched and/or selectively stripped to form a combined photomask for transferring the pattern onto the hardmask). The patterned features formed (e.g., etched) within the hardmask correspond, at least partially, to buried bitlines which will be formed within the substrate. More particularly, respective spacings between the features correspond to lightly doped channels (LDC) implanted within the substrate, and the bitlines will be subsequently formed within the LDCs. The spacings within the hardmask can be formed to have respective widths of between about 110 to 150 nano-meters, for example.

At 510 an LDC implant is performed to establish lightly doped channel regions within the substrate. The implant is performed through the first insulating layer and the charge trapping layer of the charge trapping dielectric layer. The patterned hardmask features, however, block virtually all of the LDC implant so that the lightly doped regions are formed substantially under the spacings to respective widths of between about 110 to 150 nano-meters, for example. Depending upon the type of device being fabricated, the LDC implant may be of a p-type material (e.g., Boron) implanted into a p-type region or well within the substrate having a concentration of a p-type dopant of about $1E17/cm^3$, for example. The LDC can, for example, be implanted at an energy level of between about 8–12 KeV and a dosage of about $1E13/cm^2$ for a resulting concentration of about $1E18/cm^3$ to a depth of about 1000 Angstroms within the substrate.

A layer of spacer material (e.g., of nitride and/or poly-based material(s)) is then formed over the patterned hardmask at 512. The spacer material can be formed to a thickness of between about 200 to 500 Angstroms, for example, and is utilized to form spacers that assist with establishing narrower buried bitlines. As such, the spacer material is then patterned (e.g., isotropically etched) at 514 to form sidewall spacers adjacent the patterned features of the hardmask, thereby reducing respective spacings between the hardmask features. The spacers can be formed to have respective widths of between about 20 to 40 nano-meters, for example.

A bitline implant is then performed at 516 to establish the buried bitlines within the semiconductor substrate. The bitline implant can include an n-type dopant, such as Arsenic, for example, and can be performed at an energy level of between about 30 to 40 KeV and a dosage of about $1E15/cm^2$ for a resulting concentration of about $2E20/cm^3$ to a depth of between about 700 to 800 Angstroms within the LDC regions of the substrate, for example. The distance between the spacers defining the respective bitline openings and thus the width of the implanted bitlines can be somewhere in the neighborhood of around 55 to 85 nanometers, for example.

The patterned hardmask and spacers are then removed (e.g., stripped away) at 518 and the remainder of the charge trapping dielectric layer is formed at 520 (e.g., to a thickness of about 100 Angstroms or less). As with the first insulating layer, this second insulating layer can be formed of an oxide dielectric such as silicon dioxide ($SiO_2$). It will be appreciated that the oxide-nitride-oxide configuration is commonly referred to as an ONO layer for convenience. It will be further appreciated that patterning the mask and spacers and performing the LDC and bitline implants before forming the second insulating layer mitigates damage to the second insulating layer which can adversely affect (e.g., lower) a threshold breakdown voltage (Vt), for example. Since the second insulating layer may contain oxide based material(s), this layer can, for instance, become damaged via exposure to plasma during the implantation processes.

Nevertheless, the present invention contemplates that the second insulating layer can be formed prior to forming the hardmask features and sidewall spacers and before the LDC and/or bitline implants are performed. In such a scenario, a first application of the second insulating layer may apply a layer of a "sacrificial" oxide based material to a thickness of between about 100 to 200 Angstroms, for example. It will be appreciated that since this layer is sacrificial, it need only be generally selective with respect to the spacer layer material and then selective with respect to the underlying charge trapping layer so that during its subsequent removal the charge trapping layer will not be adversely damaged.

It will be further appreciated that this sacrificial second insulating layer is accordingly formed to a greater thickness relative to the other layers since it will likely be damaged and/or made somewhat non-uniform as a result of subsequent processing activities (e.g., exposure to etchants during patterning and/or plasma during implantations). The sacrificial" second insulating layer can be removed after the LDC and/or bitline implants have been performed and the hardmask features and sidewall spacers have been removed. A new/final second insulating layer can then be formed over the charge trapping layer (e.g., to a thickness of about 100 Angstroms or less).

A layer of wordline material is then formed over the charge trapping layer at 522. The wordline material can, for example, include polysilicon. Finally, the wordline material is patterned at 524 to establish wordlines over the buried bitlines (e.g., as depicted in FIGS. 3 and 4). The methodology may then continue on for further back-end processing.

Figure 6:
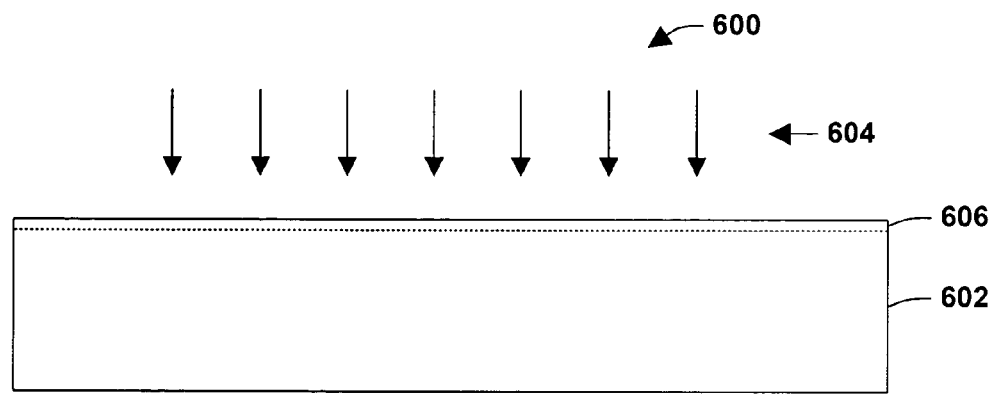
FIGS. 6–21 are cross-sectional illustrations of memory formed according to one or more aspects of the present invention.

Turning now to FIGS. 6–21, an exemplary technique for forming a memory device 600 according to one or more aspects of the present invention is disclosed (FIG. 6). In particular, the memory 600 is formed with LDC implants to mitigate Vt roll-off and facilitate scaling and resultant enhanced packing density via reducing the size of buried bitlines which was heretofore not feasible. The memory device 600 so formed may, for example, correspond to a portion of a memory core such as may include at least part of one of the M by N array cores depicted in FIG. 1.

Initially, a semiconductor substrate 602 upon which the memory is formed is subjected to a threshold adjustment implant 604 to establish a region 606 of the substrate 602 that is more heavily doped than the remainder of the semiconductor substrate (FIG. 6). The substrate may itself be doped with a p-type dopant such as Boron, for example, and the threshold adjustment implant ($V_{tadjust}$) may include a greater concentration of and/or a higher energy implant of the same or different p-type dopant, for example. The threshold adjustment implant 604 assists in controlling a threshold voltage of the memory device 600. The threshold adjustment implant, however, is optional and may be skipped in accordance with the present invention.

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 7:
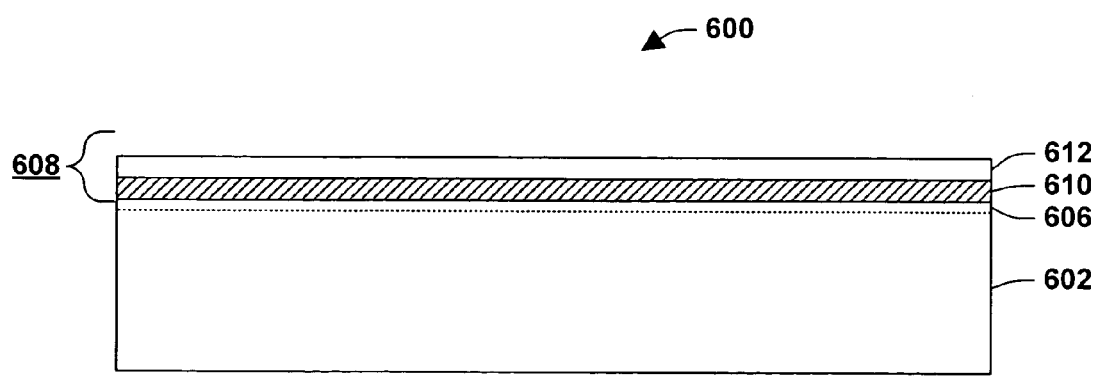

A portion of a charge trapping dielectric layer 608 is then formed over the semiconductor substrate 602 (FIG. 7). This portion of the charge trapping dielectric layer 608 includes a first insulating layer 610 and a charge trapping layer 612. The first insulating layer 610 may be formed of an oxide dielectric such as silicon dioxide ($SiO_2$), for example, and the charge trapping layer 612 may be formed of a nitride dielectric such as silicon nitride ($Si_xN_y$), for example. The first insulating layer 610 can be formed to a thickness of about 70 Angstroms or less, for example, while the charge trapping layer 612 can be formed to a thickness between about 60 to 80 Angstroms.

Figure 8:
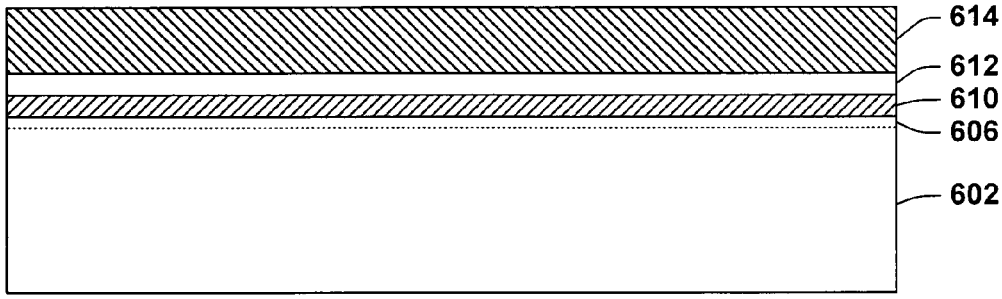

A layer of hardmask material 614 is then formed over the charge trapping layer 612 (FIG. 8). An optional antireflective coating (ARC) layer (not shown) that may include an organic material, such as silicon nitride or silicon oxynitride, for example, can be formed over the hardmask, and a resist (also not shown) can be formed over the ARC layer to facilitate patterning the hardmask 614. The ARC layer in particular assists with mitigating reflection during exposure and thereby improves the fidelity of pattern transfer. The hardmask 614 can, for example, be formed from nitride and/or poly-based material(s) that are applied to a thickness of between about 500 to 1200 Angstroms, for example.

Figure 9:
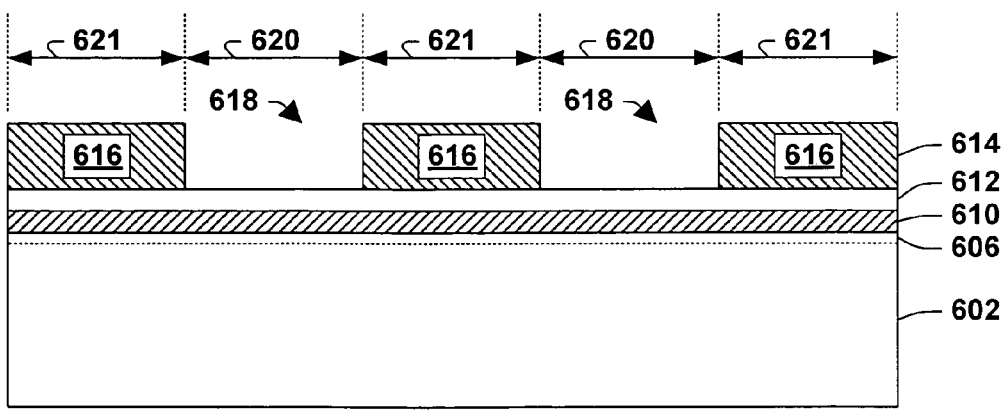

The hardmask 614 is then patterned (e.g., after both the resist and optional ARC layers have been patterned, exposed, etched and/or selectively stripped to form a combined photomask for transferring the pattern onto the hardmask) (FIG. 9). The resulting hardmask features 616 formed (e.g., etched) from the hardmask 614 correspond, at least partially, to buried bitlines which will be formed within the substrate. More particularly, respective spacings 618 between the features 616 correspond to lightly doped channels (LDC) implanted within the substrate 602, and the bitlines will subsequently be formed within the LDCs. The spacings 618 can be formed to have respective widths 620 of between about 110 to 150 nano-meters, for example. As will be further appreciated below, the LDC regions will allow the center-to-center spacings (dictated by a width 621 of the features 616) to be reduced.

Figure 10:
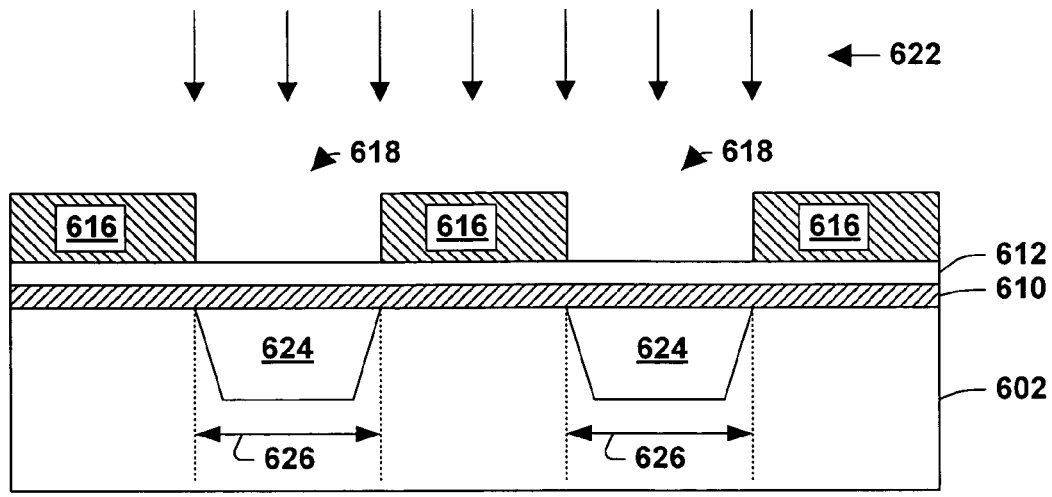

An LDC implant 622 is then performed to establish lightly doped channel regions 624 within the substrate (FIG. 10). The implant 622 is performed through the first insulating layer 610 and the charge trapping layer 612 of the charge trapping dielectric layer 608. The patterned hardmask features 616, however, block virtually all of the LDC implant so that the lightly doped regions 624 are formed substantially under the spacings 618 to respective widths 626 of between about 110 to 150 nano-meters, for example. Depending upon the type of device being fabricated, the LDC implant may be of a p-type material (e.g., Boron) implanted into a p-type region or well within the substrate 602 having a concentration of a p-type dopant of about $1E17/cm^3$, for example. The LDC can, for example, be implanted at an energy level of about 10 KeV and a dosage of about $1E13/cm^2$ for a resulting concentration of about $1E18/cm^3$ to a depth of about 1000 Angstroms within the substrate 602.

Figure 11:
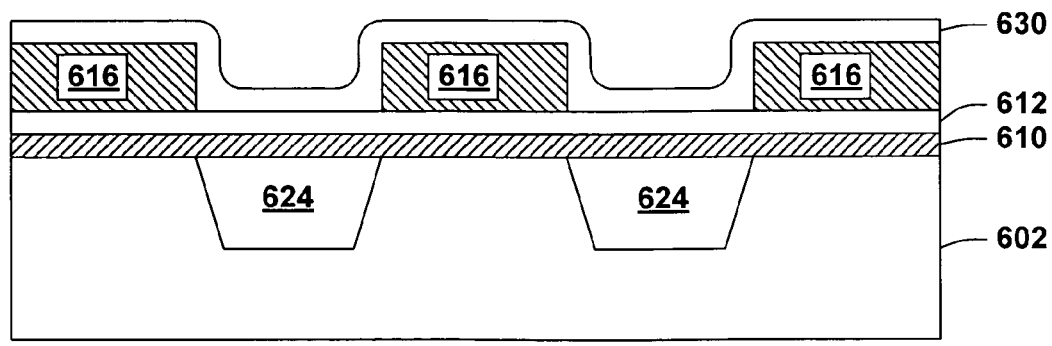
Figure 12:
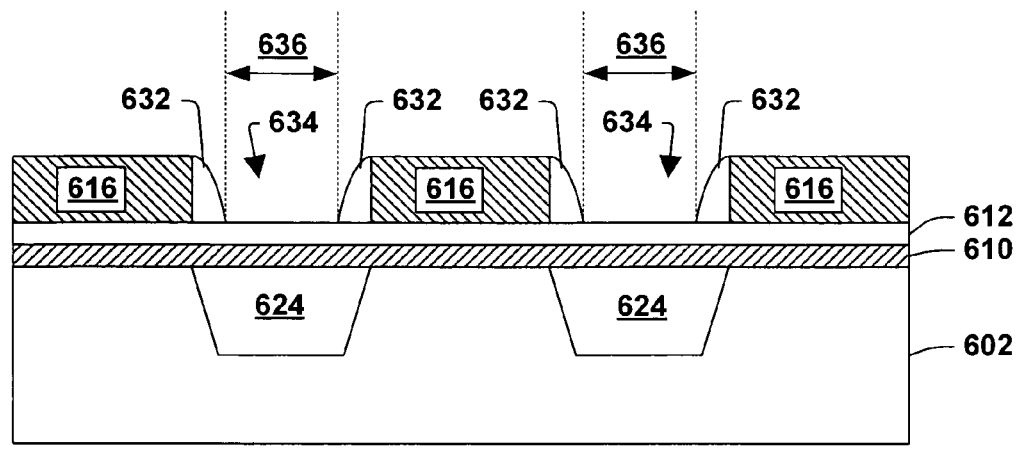

A layer of spacer material 630 (e.g., of nitride and/or poly-based material(s)) is then formed over the patterned hardmask features 616 and exposed portions of the charge trapping layer 612 (FIG. 11). The spacer material 630 can be formed to a thickness of between about 200 to 500 Angstroms, for example, and is utilized to form spacers that assist with establishing narrower buried bitlines. As such, the spacer material 630 is then patterned (e.g., isotropically etched) to form sidewall spacers 632 adjacent to the patterned features 616 of the hardmask (FIG. 12). The spacers 632 can be formed to have respective widths of between about 20 to 40 nano-meters, for example. The spacers 632 thereby establish secondary spacings or bitline openings 634 between the hardmask features 616. The secondary spacings 634 have respective widths 636 that are smaller than that 620 of the original LDC spacings 618 (FIG. 9), such as in the neighborhood of between about 60 to 80 nano-meters, for example.

Figure 13:
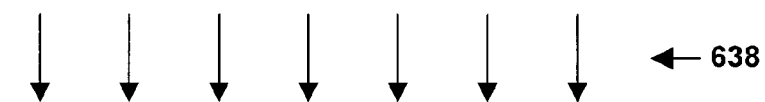
Figure 13:
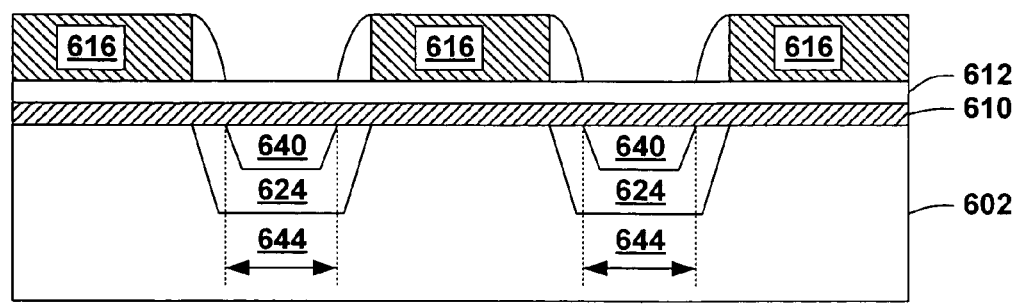
Figure 14:
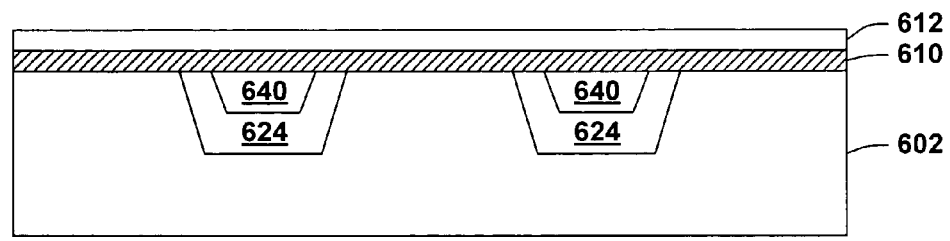

A bitline implant 638 is then performed to establish the buried bitlines 640 within the semiconductor substrate 602 (FIG. 13). The bitline implant 638 can include an n-type dopant, such as Arsenic, for example, and can be performed at an energy level of between about 30 to 40 KeV and a dosage of about $1E15/cm^2$ for a resulting concentration of about $2E20/cm^3$ to a depth of between about 700 to 800 Angstroms within the LDC regions 624 of the substrate 602, for example. The spacers 632 block substantially all of the bitline implant and the buried bitlines 640 thus have respective widths 644 corresponding to that 636 of the bitline openings 634 (FIG. 12) or between about 60 to 80 nano-meters, for example.

Figure 15:
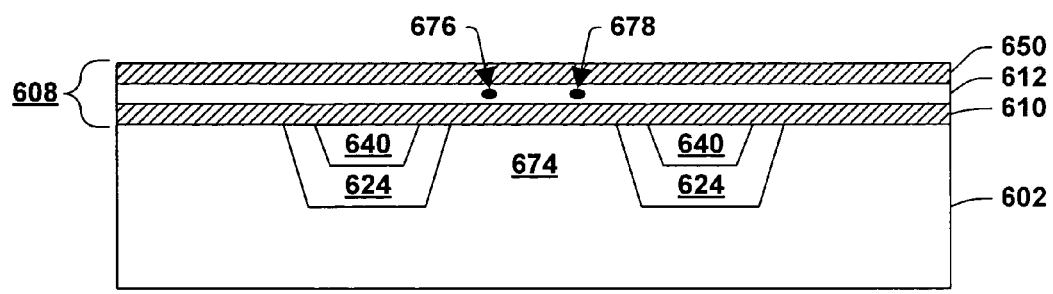

The hardmask features 616 and sidewall spacers 632 are then removed (e.g., stripped away) (FIG. 14), and the remainder of the charge trapping dielectric layer 608 is formed (FIG. 15). More particularly, a second insulating layer 650 is formed over the charge trapping layer 612 (e.g., to a thickness of about 100 Angstroms or less). As with the first insulating layer 610, this second insulating layer 650 can be formed of an oxide dielectric such as silicon dioxide ($SiO_2$). It will be appreciated that the charge trapping dielectric layer 608 is commonly referred to as an ONO layer given the oxide-nitride-oxide configuration, employed in some examples.

Figure 16:
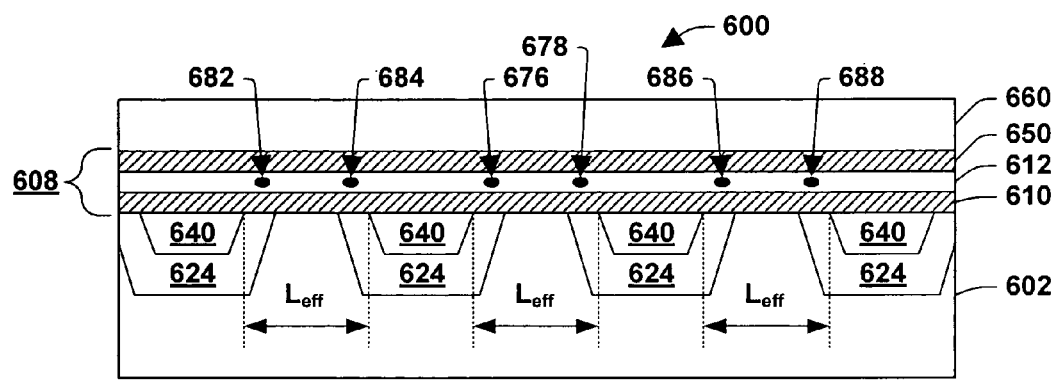
Figure 17:
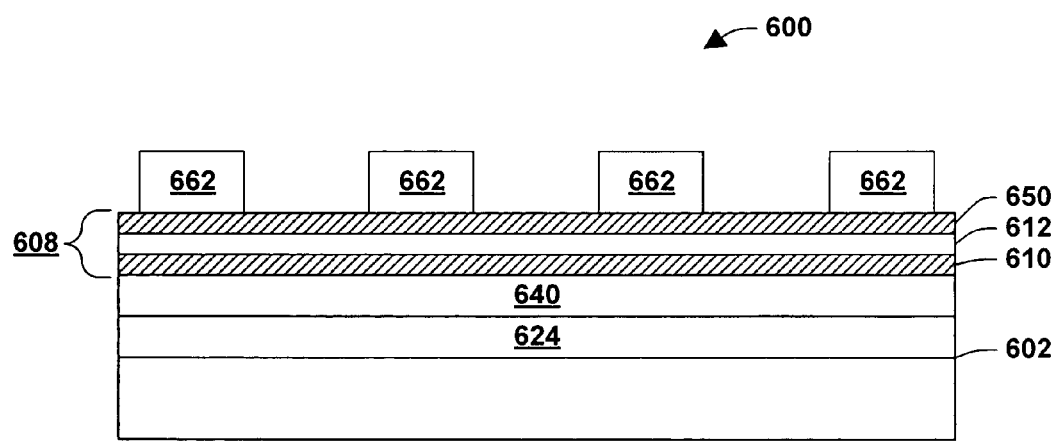

A layer of wordline material 660 is then formed over the ONO layer 608 (FIG. 16). The wordline material 660 can, for example, include polysilicon or other type of conductive material. Finally, the wordline material 660 is patterned to establish wordlines 662 over the LDC regions 624 and the buried bitlines 640 (FIG. 17). It will be appreciated that FIG.

17 may correspond to the device depicted in FIG. 3 taken along lines 17—17. Accordingly, the illustration depicted in FIG. 17 is rotated 90 degrees relative to the images illustrated in FIGS. 6–16. As such, a side view or view along the length of an LDC region 624 and a buried bitline 640 is illustrated in FIG. 17. Also, it will be appreciated that the LDC regions 624 and the buried bitlines 640 are oriented at substantially right angles relative to the wordlines 662 so that individual memory cells can be addressed. As can be seen in FIG. 16, with the LDC implant regions 624 the channel length ($L_{eff}$) can be decreased with Vt roll-off, thereby enabling the bitline to bitline spacing to reduce, thereby resulting in improved memory density.

It will be appreciated that patterning the layer of hardmask material 614 (FIG. 9) and spacer material 630 (FIG. 12) and performing the LDC 622 (FIG. 10) and bitline 638 (FIG. 13) implants before forming the second insulating layer 650 (FIG. 15) as described above mitigates damage to the second insulating layer 650 which can, for example, adversely affect (e.g., lower) a threshold breakdown voltage ($V_T$) of the transistor. Since the second insulating layer 650 likely contains oxide based material(s), this layer can, for instance, become damaged via exposure to plasma during the implantation processes 622, 638.

Figure 18:
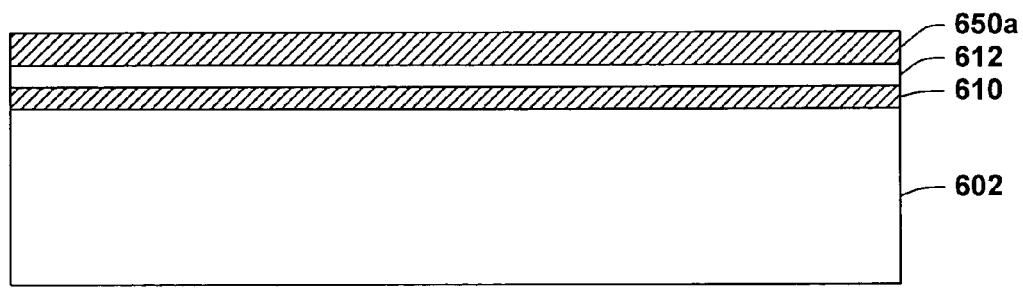

Nevertheless, the present invention contemplates that the second insulating layer 650 can be formed prior to forming the hardmask features 616 and sidewall spacers 632 and before the LDC 622 and/or bitline 638 implants are performed. In such a scenario, a first application of the second insulating layer may apply a layer of "sacrificial" oxide based material 650a to a thickness of between about 100 to 200 Angstroms, for example (FIG. 18). It will be appreciated that this sacrificial layer 650a is generally formed to a greater thickness than the first oxide layer 610 and charge trapping layer 612 since it will likely be damaged and/or made somewhat non-uniform as a result of subsequent processing activities.

Figure 19:
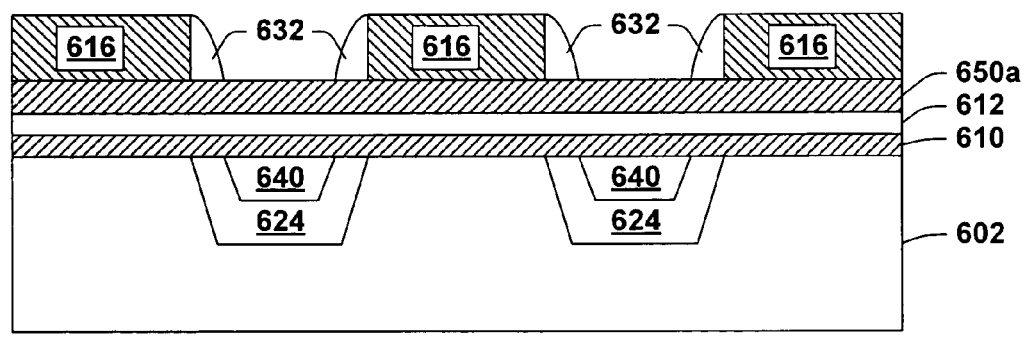
Figure 20:
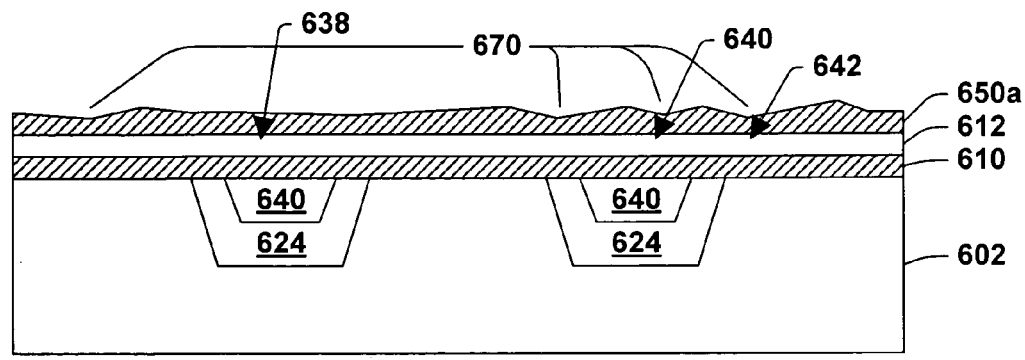

The hardmask features 616 and LDC regions 624 can then be established as described above, and the sidewall spacers 632 and buried bitline 640 can similarly be established as previously described (FIG. 19). The hardmask features 616 and sidewall spacers 632 can then be stripped from layer 650a (FIG. 20). This may reveal defects and/or pitting 670 within layer 650a (e.g., that result from exposure to etchants during patterning and/or plasma during implantations).

Figure 21:
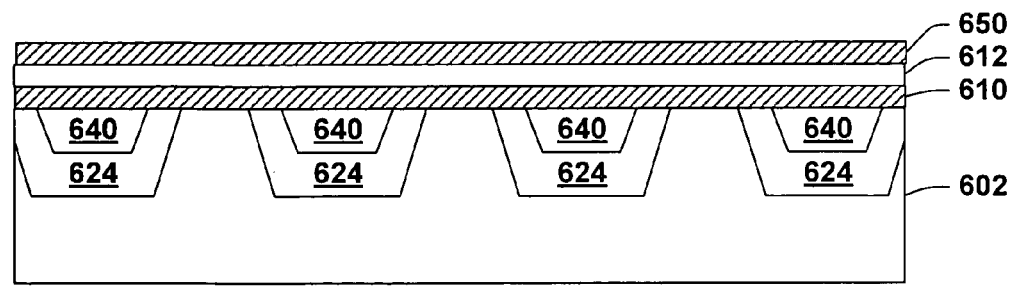

The sacrificial oxide layer 650a can be removed and the final second insulating layer 650 can then be formed over the charge trapping layer 612 (e.g., to a thickness of about 100 Angstroms or less) (FIG. 21). The hardmask, spacer and implant processing can then proceed as previously discussed. It will be appreciated that since layer 650a is sacrificial, it need only be generally selective with respect to the spacer material 630 and then selective with respect to the underlying charge trapping layer 612 so that during its removal the charge trapping layer 612 will not be adversely affected.

Returning to FIG. 15, it will be appreciated that the buried bitlines 640 serve as source and drain regions of the transistor or memory cell 600, and a channel 674 is defined between these regions. The channel 674 underlies a gate (not shown) of the transistor 600, where wordlines (FIGS. 16 and 17) generally serve as the gates of transistors operating as memory devices. When a voltage of a sufficient magnitude (e.g., a threshold voltage (Vt)) is applied to the gate of the transistor, electric fields generated within the transistor allow currents to flow between the source and drain regions. This allows charges 676, 678 (which correspond to bits of data) to be stored (programmed) within and/or erased from the charge trapping layer 612. It will be appreciated that dual charges or bits are discussed herein as one or more aspects of the present invention have application to dual bit memory cells.

As scaling occurs, however, and channel lengths are decreased, the threshold voltage Vt changes. For example, as source and drain regions are brought closer together, smaller and smaller voltages are required to program and/or erase bits of data. This is a major reason for Vt roll-off and can lead to data being unintentionally erased and/or programmed. The LDC regions 624 surrounding the source and drain regions, however, reach into the channel 674 and change the dopant composition thereof. This alters the electrical properties of the channel 674 and allows the Vt to remain more constant as scaling occurs. In this manner the transistor 600 remains more reliable and has more predictable behavior as feature sizes are reduced.

Additionally, the implementation of the sidewall spacers 632 allows the buried bitlines 640 to be formed to a width 644 which is less than that of conventional bitlines (e.g., by an amount substantially equal to the width of corresponding pairs of sidewall spacers 632). The narrower bitlines 640 thus allow more bitlines to be formed within the same or a smaller area while maintaining an effective channel length ($L_{eff}$) (FIG. 16) whereby issues such as cross-talk, complimentary bit disturb (CBD), leakage currents, etc. are sufficiently mitigated. This allows more transistors/memory cells having corresponding (dual) bits of data 676 & 678, 682 & 684, 686 & 686 to be "packed" onto a semiconductor wafer or die.

Figure 22:
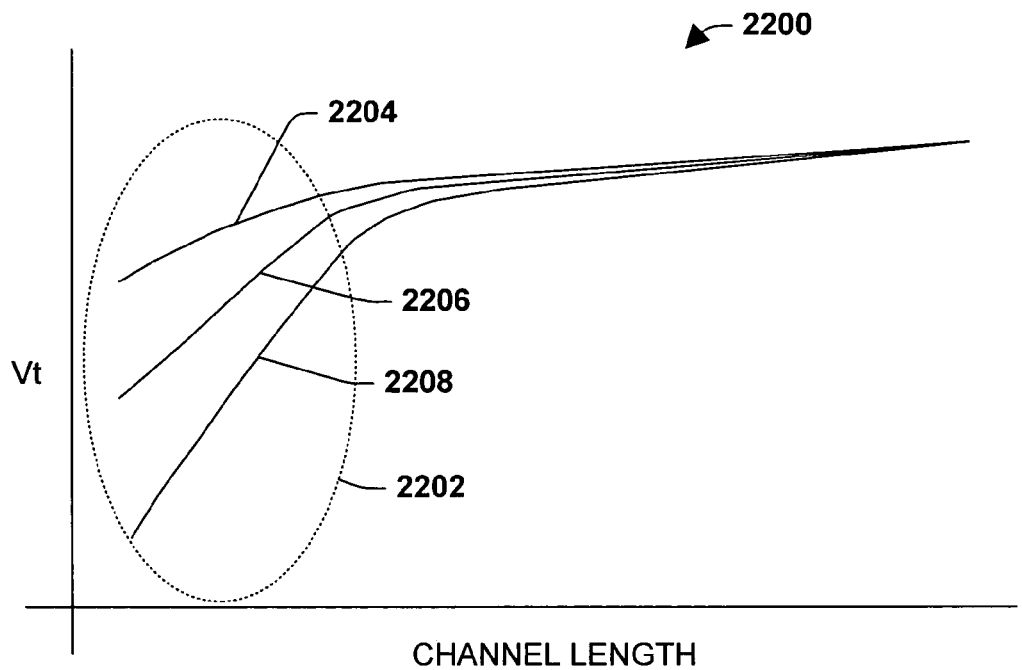
FIG. 22 is a graphical depiction illustrating exemplary curves for Vt roll-off and Vt variations among memory devices formed without LDC implants.
Figure 23:
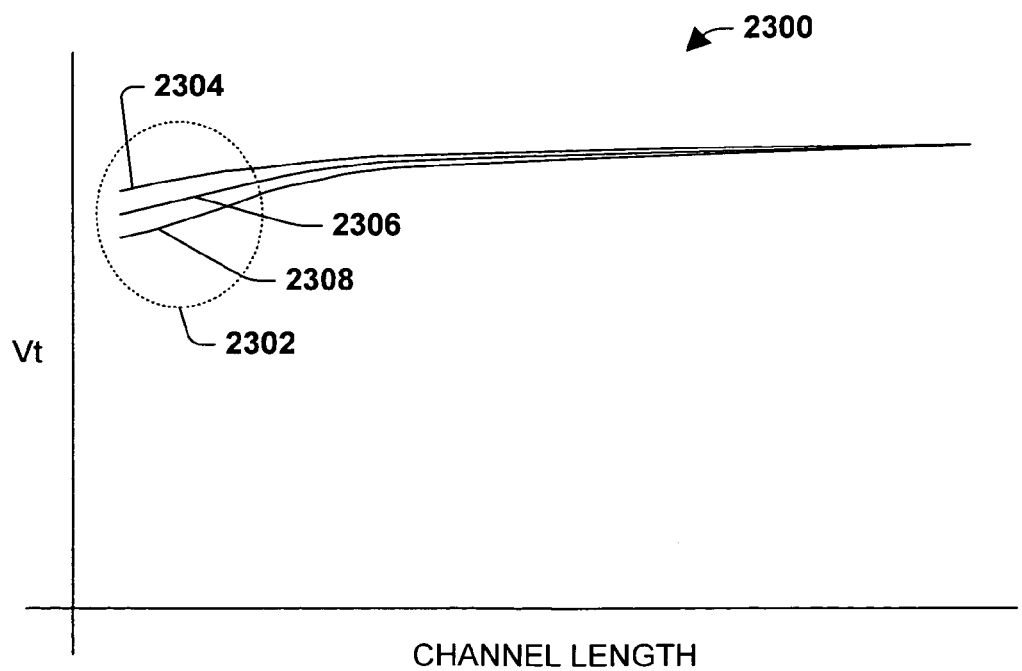
FIG. 23 is a graphical depiction illustrating exemplary curves for Vt roll-off and Vt variations among memory devices formed with LDC implants according to one or more aspects of the present invention.

Turning to FIGS. 22 and 23, exemplary graphical depictions 2200, 2300 are presented for Vt roll-off. Channel length is depicted on the x-axis and Vt roll-off is plotted on the y-axis in the graphs. Both channel length and Vt roll-off increase in the graphs 2200, 2300 as the plots move along the axes away from the origin. In both plots 2200, 2300 the threshold voltage Vt decreases as the channel length decreases. However, FIG. 22 illustrates Vt roll-off for conventional devices whereas the plots in FIG. 23 correspond to Vt roll-off experienced in memory devices wherein LDC implants are implemented in accordance with one or more aspects of the present invention. It can be seen that the curves have been "flattened out" in FIG. 23, and that the drop-off or "roll-off" in Vt is significantly more drastic for conventional devices than for LDC devices as channel length decreases. Accordingly, it can be said that conventional devices are much more sensitive to variations in channel length than are LDC devices.

Additionally, the change in Vt among different conventional devices, particularly within encircled area 2202, is much more dramatic than that same change in LDC devices within encircled area 2302. As such, LDC memory devices corresponding to curves 2304, 2306, 2308 are all likely to be programmed or erased when a particular Vt is applied thereto. However, when a particular Vt is applied to devices corresponding to curves 2204, 2206, 2208, all of the devices may not be programmed or erased, especially where the Vt corresponds to a value within the encircled area 2202. This can lead to inconsistent, unreliable and unpredictable device behavior, as well as to missing and/or corrupt data within the memory devices. Accordingly, forming densely packed transistor based memory devices in the manner describe herein can lead to more reliable and consistent device performance, among other things.

It will be appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a dual bit memory core array upon a semiconductor substrate, the method comprising:
    forming a portion of a charge trapping dielectric layer over the substrate;
    forming a hardmask over the portion of the charge trapping dielectric layer;
    patterning the hardmask to form hardmask features having respective first spacings there-between, the first spacings having respective first widths;
    performing a lightly doped channel (LDC) implant through the portion of the charge trapping dielectric layer to establish LDC regions within the substrate having respective LDC widths corresponding substantially to the first widths;
    forming a spacer material over the hardmask features and exposed areas of the portion of the charge trapping dielectric layer;
    patterning the spacer material to form sidewall spacers adjacent to the hardmask features and defining respective second spacings there-between, the second spacings having respective second widths that are less than the first widths;
    performing a bitline implant through the portion of the charge trapping dielectric layer to establish buried bitlines within the substrate having respective bitline widths corresponding substantially to the second widths;
    removing the patterned hardmask features and sidewall spacers;
    forming the remainder of the charge trapping dielectric layer over the portion of the charge trapping dielectric layer;
    forming a wordline material over the charge trapping dielectric layer; and
    patterning the wordline material to form wordlines that overlie the LDC regions and buried bitlines.

2. The method of claim 1, wherein LDC implant is performed at an energy level of about between about 8–12 KeV.

3. The method of claim 2, wherein LDC implant is performed at a dosage of about $1E13/cm^2$.

4. The method of claim 3, wherein the LDC regions have a dopant concentration of about $1E18/cm^3$ within the substrate.

5. The method of claim 4, wherein the LDC regions extend to a depth of about 1000 Angstroms within the substrate.

6. The method of claim 5, wherein the bitline implant is performed at an energy level of between about 30–40 KeV.

7. The method of claim 6, wherein bitline implant is performed at a dosage of about $1E15/cm^2$.

8. The method of claim 7, wherein the buried bitlines have a dopant concentration of about $2E20/cm^3$ within the substrate.

9. The method of claim 8, wherein the buried bitlines extend to a depth of between about 700–800 Angstroms within the substrate.

10. The method of claim 9, wherein the first widths are between about 110 to 150 nano-meters.

11. The method of claim 10, wherein the LDC widths are around 130 nano-meters.

12. The method of claim 11, wherein the second widths are between about 55 to 85 nano-meters.

13. The method of claim 12, wherein the bitline widths are around 70 nano-meters.

14. The method of claim 13, wherein the LDC implant includes a p-type dopant.

15. The method of claim 14, wherein the bitline implant dopant includes an n-type dopant.

16. The method of claim 15, wherein the sidewall spacers have widths of between about 20 to 40 nano-meters.

17. The method of claim 16, wherein the substrate includes a p-type dopant at a concentration of about $1E17/cm^3$.

18. The method of claim 1, wherein the charge trapping dielectric layer comprises:
    a first insulating layer over the semiconductor substrate;
    a charge trapping layer over the first insulating layer; and
    a second insulating layer over the charge trapping layer.

19. The method of claim 18, wherein the first and second insulating layers comprise silicon dioxide.

20. The method of claim 19, wherein the charge-trapping layer comprises silicon nitride.

21. The method of claim 20, wherein the first insulating layer is formed to a thickness of about 70 Angstroms or less.

22. The method of claim 21, wherein the charge trapping layer is formed to a thickness of between about 60 to 80 Angstroms.

23. The method of claim 22, wherein the second insulating layer is formed to a thickness of about 100 Angstroms or less.

24. The method of claim 1, wherein the wordlines are oriented at substantially right angles relative to the LDC regions and the buried bitlines.

25. The method of claim 1, comprising:
    performing a threshold adjustment implant into the semiconductor substrate prior to forming the portion of the charge trapping dielectric layer.

* * * * *